(12) United States Patent
Kim et al.

(10) Patent No.: US 9,735,143 B2
(45) Date of Patent: Aug. 15, 2017

(54) DISPLAY SUBSTRATE

(71) Applicant: Samsung Display Co., Ltd., Yongin, Gyeonggi-Do (KR)

(72) Inventors: Young-Jin Kim, Yongin-si (KR); Byoung-Ju Kim, Gwangmyeong-si (KR); Jae-Hyun Park, Yongin-si (KR); Kap Soo Yoon, Cheonan-si (KR); Jun Hyuck Jeon, Cheonan-si (KR); Jeong Uk Heo, Asan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 23 days.

(21) Appl. No.: 14/788,278

(22) Filed: Jun. 30, 2015

(65) Prior Publication Data

US 2016/0217756 A1 Jul. 28, 2016

(30) Foreign Application Priority Data

Jan. 27, 2015 (KR) .......................... 10-2015-0013042

(51) Int. Cl.
*H01L 27/02* (2006.01)
*G02F 1/1362* (2006.01)
(Continued)

(52) U.S. Cl.
CPC .... *H01L 27/0255* (2013.01); *G02F 1/136204* (2013.01); *G09G 3/3648* (2013.01);
(Continued)

(58) Field of Classification Search
CPC ....... G11C 11/412; G11C 19/00; G11C 19/28; G11C 8/04; G11C 11/4074; G09G 3/3648; G09G 2330/06; G09G 3/3677; G09G 3/3688; G09G 2330/04; G09G 3/3611; G09G 3/3674; G09G 3/3685;
(Continued)

(56) References Cited

U.S. PATENT DOCUMENTS

| | | | | |
|---|---|---|---|---|
| 6,333,769 B1* | 12/2001 | Suzuki | ............ | G02F 1/136204 349/141 |
| 6,501,630 B1* | 12/2002 | Colclaser | ............ | H01L 27/0255 361/56 |
| 6,791,632 B2* | 9/2004 | Lee | ................... | G02F 1/136204 349/40 |
| 7,928,437 B2* | 4/2011 | Shin | ..................... | H01L 27/0248 257/59 |
| 8,373,813 B2* | 2/2013 | Park | .................. | G02F 1/136204 257/72 |
| 2004/0174645 A1* | 9/2004 | Nojiri | ............... | G02F 1/136204 361/56 |
| 2005/0162581 A1* | 7/2005 | Lim | ................... | G02F 1/136259 349/54 |
| 2010/0073009 A1* | 3/2010 | Wang | ..................... | G09G 3/006 324/537 |

(Continued)

FOREIGN PATENT DOCUMENTS

| KR | 10-2011-0106492 A | 9/2011 |
|---|---|---|
| KR | 10-2013-0024032 A | 3/2013 |
| KR | 10-1330421 B1 | 11/2013 |

*Primary Examiner* — Sanjiv D Patel
(74) *Attorney, Agent, or Firm* — Robert E. Bushnell, Esq.

(57) ABSTRACT

A display substrate. The display substrate includes: a plurality of pixel units; a gate driving unit supplying a gate signal to the plurality of pixel units and including a plurality of shift register circuits which are dependently connected to each other; a vertical start line supplying a vertical start signal to the gate driving unit; and an electrostatic protection unit having two ends connected to different points of the vertical start line, the electrostatic protection unit including a plurality of back-to-back diodes connected in series with each other between the two ends. Each of the back-to-back diodes include a pair of diodes connected in parallel to each other in a bidirectional diode structure.

10 Claims, 11 Drawing Sheets

(51) Int. Cl.
*G09G 3/36* (2006.01)
*H02H 9/04* (2006.01)

(52) U.S. Cl.
CPC ............... *G09G 2300/0408* (2013.01); *G09G 2300/0413* (2013.01); *G09G 2300/0426* (2013.01); *G09G 2330/04* (2013.01); *H02H 9/046* (2013.01)

(58) Field of Classification Search
CPC ......... G09G 2300/0426; H05K 1/0259; H05K 9/0067; H05K 1/026; H05K 1/0293; H05K 1/18; H01L 23/60; H01L 29/747; H01L 27/124; G02F 1/13452; G02F 1/1345; G02F 1/13458; G02F 2001/13456; G02F 1/1362; G02F 1/136204
See application file for complete search history.

(56) References Cited

U.S. PATENT DOCUMENTS

| | | | | |
|---|---|---|---|---|
| 2011/0134104 A1* | 6/2011 | Yoon | ............... | G09G 3/3677 345/212 |
| 2013/0050173 A1* | 2/2013 | Koo | ............... | G02F 1/136204 345/212 |
| 2014/0092510 A1* | 4/2014 | Huang | ............... | H02H 9/045 361/56 |
| 2015/0097264 A1* | 4/2015 | Tsai | ............... | H01L 27/0255 257/506 |
| 2015/0194090 A1* | 7/2015 | Lin | ............... | G09G 3/2092 345/205 |

\* cited by examiner

DISPLAY SUBSTRATE

CLAIM OF PRIORITY

This application makes reference to, incorporates the same herein, and claims all benefits accruing under 35 U.S.C. §119 from an application earlier filed in the Korean Intellectual Property Office on the 27 Jan. 2015 and there duly assigned Serial No. 10-2015-0013042.

BACKGROUND OF THE INVENTION

Field of the Invention

The present disclosure relates to a display substrate, and more particularly, to a display substrate in which a gate driving circuit is embedded.

Description of the Related Art

A liquid crystal display includes two substrates on which electrodes are each formed, and a liquid crystal layer interposed between the two substrates. The two substrates in the liquid crystal display are disposed so that the electrodes face each other, and an image is displayed by light transmittance which is changed by liquid crystal molecules rotated by an electrical signal applied to the electrodes.

The liquid crystal display includes a display panel in which a liquid crystal material is injected between the two substrates, a backlight unit disposed on a rear surface of the display panel so as to be used as a light source, and a driving unit for driving the display panel.

Typically, the driving unit is implemented on a printed circuit board (PCB), and the PCB may be classified into a gate PCB connected to gate lines of the display panel, and a data PCB connected to data lines of the display panel.

In the case, the printed circuit board is configured as the gate PCB and the data PCB, respectively, and the gate PCB and the data PCB are mounted on one side surface of the display panel, a volume of the display device is increased, which also causes weight of the display device to be increased. Recently, in order to solve the above-mentioned problems, a display device having a gate in panel (GIP) structure in which only the data PCB is mounted on one side surface of the display panel and the gate PCB is formed in the display panel has been proposed.

In the case in which electrostatic is generated during a process of manufacturing the display panel, since line short circuits occur or elements in an active area are broken, driving defect of the display panel may be caused. Particularly, in the case in which electrostatic is introduced into a line applying a vertical start signal for starting an operation to a first stage circuit in a gate driving circuit, malfunction may also occur in a next stage circuit and damage breaking the elements in a display area may further occur.

The above information disclosed in this Background section is only for enhancement of understanding of the background of the disclosure and therefore it may contain information that does not form the prior art that is already known in this country to a person of ordinary skill in the art.

SUMMARY OF THE INVENTION

The present disclosure has been made in an effort to provide a display substrate having advantages of including an electrostatic protection means for protecting a gate driving circuit from electrostatic generated from a line applying a vertical start signal to the gate driving circuit.

An exemplary embodiment of the present disclosure provides a display substrate including: a plurality of pixel units; a gate driving unit supplying a gate signal to the plurality of pixel units and including a plurality of shift register circuits which are dependently connected to each other; a vertical start line supplying a vertical start signal to the gate driving unit; and an electrostatic protection unit having both ends connected to different points of the vertical start line and including a plurality of back-to-back diodes connected in series with each other.

Another embodiment of the present disclosure provides a display substrate including: a plurality of pixel units; a gate driving unit supplying a gate signal to the plurality of pixel units and including a plurality of shift register circuits which are dependently connected to each other; a vertical start line supplying a vertical start signal to the gate driving unit; a common voltage line supplying a common voltage to the gate driving unit; and an electrostatic protection unit distributing electrostatic introduced into the vertical start line into the common voltage line, wherein the electrostatic protection unit includes: a first diode unit connected between the vertical start line and the common voltage line and including one or more first back-to-back diodes connected in series with each other, a second diode unit connected between the vertical start line and the common voltage line and including one or more second back-to-back diodes connected in series with each other, and a dummy line having both ends connected to a connection line connecting the first diode unit and a first point of the common voltage line to each other and a connection line connecting the second diode unit and a second point of the common voltage line to each other.

Yet another embodiment of the present disclosure provides a display substrate including: a plurality of pixel units; a gate driving unit supplying a gate signal to the plurality of pixel units and including a plurality of shift register circuits which are dependently connected to each other; a vertical start line supplying a vertical start signal to the gate driving unit; a common voltage line supplying a common voltage to the gate driving unit; and an electrostatic protection unit distributing electrostatic introduced into the vertical start line into the common voltage line, wherein the electrostatic protection unit includes: a first diode unit connected between the vertical start line and the common voltage line and including one or more first back-to-back diodes connected in series with each other, and a ticks thin film transistor connected between the vertical start line and the first diode unit.

According to an embodiment of the present disclosure, an energy of electrostatic introduced into the vertical start line using a plurality of back-to-back diodes and ticks thin film transistors is distributed or reduced through multiple paths, whereby the switching element of the gate driving unit may be protected from electrostatic introduced into the vertical start line.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
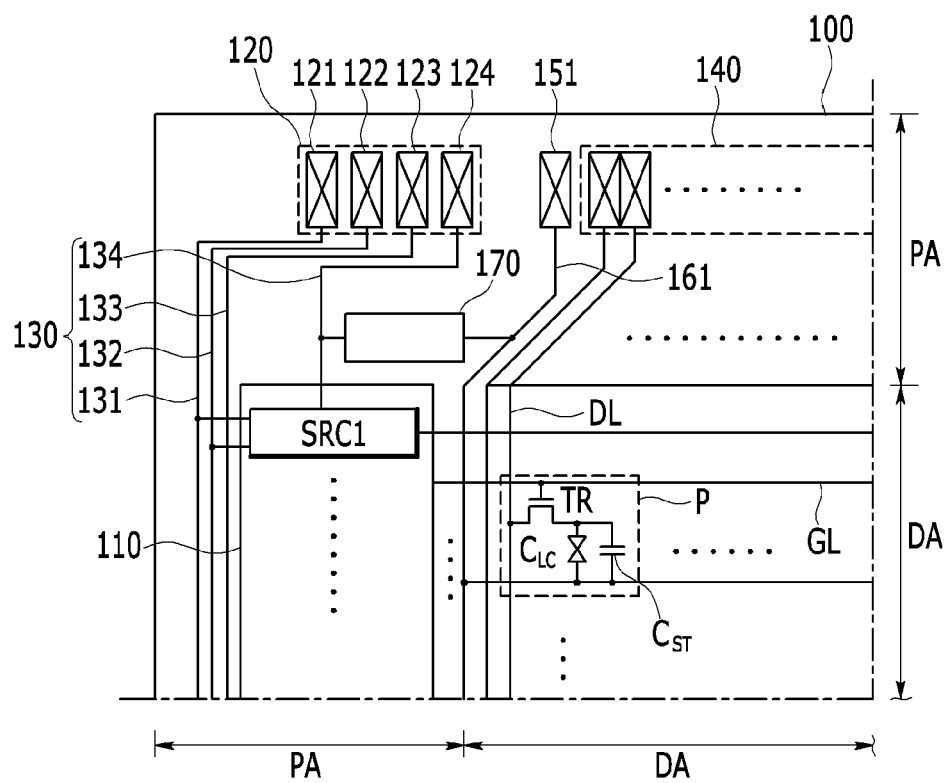
FIG. 1 is a plan view of a portion of a display substrate according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Hereinafter, a display substrate according to an exemplary embodiment of the present invention will be described in more detail with reference to the accompanying drawings.

FIG. 1 is a plan view of a portion of a display substrate according to an exemplary embodiment of the present invention.

Referring to FIG. 1, a display substrate according to an exemplary embodiment of the present invention includes a base substrate 100, wherein the base substrate 100 includes a display area DA in which a plurality of pixel units P are formed, and a peripheral area PA surrounding the display area DA.

The display area DA has a plurality of gate lines GL and a plurality of data lines DL formed therein. In addition, the display area DA is provided with the plurality of pixel units P defined by the gate lines GL and the data lines DL which intersect with each other.

Each pixel unit P includes a switching element TR connected to the gate line GL and the data line DL, a liquid crystal capacitor $C_{LC}$ connected to the switching element TR, and a storage capacitor $C_{ST}$. According to some exemplary embodiments, the storage capacitor $C_{ST}$ may be omitted.

The display area DA has a plurality of storage lines 161 formed therein. The storage line 161 is extended in the same direction as the data line DL.

The peripheral area PA has a gate driving unit 110, a gate pad unit 120, a data pad unit 140, and a storage pad unit 151 formed therein.

The gate driving unit 110 is electrically connected to the gate lines GL and applies gate signals to the gate lines GL. The gate driving unit 110 includes a plurality of stages that output the gate signals to the respective gate lines GL. The plurality of stages are dependently connected to each other and each stage includes a shift register circuit SRCn.

The gate driving unit 110 starts a driving thereof in the case in which a vertical start signal is applied to a first stage shift register circuit SRC1 of a plurality of stages. Each stage includes a plurality of switching elements, wherein the switching elements may be formed by the same process as the switch elements TR formed in the display area DA.

The gate pad unit 120 receives driving signals applied to the gate driving unit 110 from the outside. For example, the gate pad unit 120 receives a source voltage signal VSS, a first clock signal CK, a second clock signal CKB, and a vertical start signal STV from the outside.

The gate pad unit 120 includes a source voltage pad 121 receiving the source voltage signal VSS, a first clock pad 122 receiving the first clock signal CK, a second clock pad 123 receiving the second clock signal CKB, and a start pad 124 receiving the vertical start signal STV.

The gate pad unit 120 is electrically connected to a signal line unit 130. The gate pad unit 120 transfers the driving signals received from the outside to the gate driving unit 110 through the signal line unit 130.

The signal line unit 130 includes a source voltage line 131, a first clock line 132, a second clock line 133, and a vertical start line 134.

The source voltage pad 121 is electrically connected to the source voltage line 131, so as to transfer the source voltage signal VSS to the source voltage line 131. The source voltage line 131 is electrically connected to the gate driving unit 110 and supplies the source voltage signal VSS to the gate driving unit 110.

The first clock pad 122 is electrically connected to the first clock line 132 and transfers the first clock signal CK to the first clock line 132. The first clock line 132 is electrically connected to the gate driving unit 110 and supplies the first clock signal CK to the gate driving unit 110.

The second clock pad 123 is electrically connected to the second clock line 133 and transfers the second clock signal CKB to the second clock line 133. The second clock line 133 is electrically connected to the gate driving unit 110 and supplies the second clock signal CKB to the gate driving unit 110.

The start pad 124 is electrically connected to the vertical start line 134 and transfers the vertical start signal STV to the vertical start line 134. The vertical start line 134 is electrically connected to the gate driving unit 110 and supplies the vertical start signal STV to the gate driving unit 110. The vertical start line 134 is electrically connected to a first stage SRC1 of the gate driving unit 110. The vertical start line 134 transfers the vertical start signal STV supplied from the start pad 124 to the first stage SRC1 of the gate driving unit 110. Meanwhile, although not shown in FIG. 1, the vertical start line 134 may be extended to a last stage (not shown) of the gate driving unit 110, so as to transfer the vertical start signal STV to the last stage.

The data pad unit 140 includes a plurality of data pads applying data signals to the data lines DL.

The storage pad 151 is supplied with a common voltage VCOM from the outside. The storage pad unit 151 is electrically connected to the storage line 161 and transfers the common voltage VCOM to the storage line 161.

The storage line 161 is electrically connected to the liquid crystal capacitor CLC and the storage capacitor CST of the pixel unit and supplies the common voltage VCOM to the liquid crystal capacitor CLC and the storage capacitor CST.

The peripheral area PA has an electrostatic protection unit 170 formed therein connected between the vertical start line 134 and the storage line 161.

As will be shown in FIGS. 3-9, the electrostatic protection unit 170 includes a plurality of back-to-back diodes connected between the vertical start line 134 and the storage line 161. The electrostatic protection unit 170 prevents a switching element of the first stage SRC1 of the gate driving unit 110 from being damaged by electrostatic by distributing electrostatic introduced into the vertical start line 134 through the start pad 124.

Figure 2:
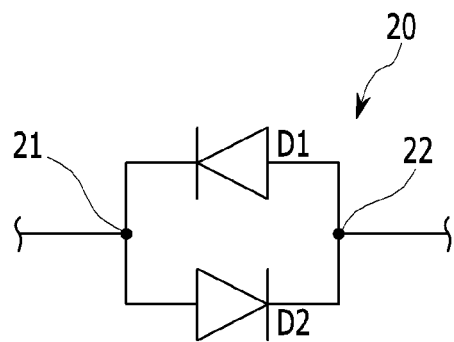
FIG. 2 shows an equivalent circuit of a back-to-back diode.

FIG. 2 is an equivalent circuit diagram of a back-to-back diode included in the electrostatic protection unit according to an exemplary embodiment of the present invention.

Referring to FIG. 2, a back-to-back diode 20 includes a pair of diodes D1 and D2 which are connected in parallel to each other between a first node 21 and a second node 22. The back-to-back diode 20 has a bidirectional diode structure formed by connecting the first and second diodes D1 and D2 having different directions in parallel to each other between the first node 21 and the second node 22.

The first diode D1 is connected in a backward direction from the first node 21 to the second node 22. That is, the first diode D1 has a cathode and an anode which are connected to the first node 21 and the second node 22, respectively.

The second diode D2 is connected in a forward direction from the first node 21 to the second node 22. That is, the second diode D2 has an anode and a cathode which are connected to the first node 21 and the second node 22, respectively.

Therefore, the cathode of the first diode D1 and the anode of the second diode D2 are connected to each other, and the anode of the first diode D1 and the cathode of the second diode D2 are connected to each other.

Figure 3:
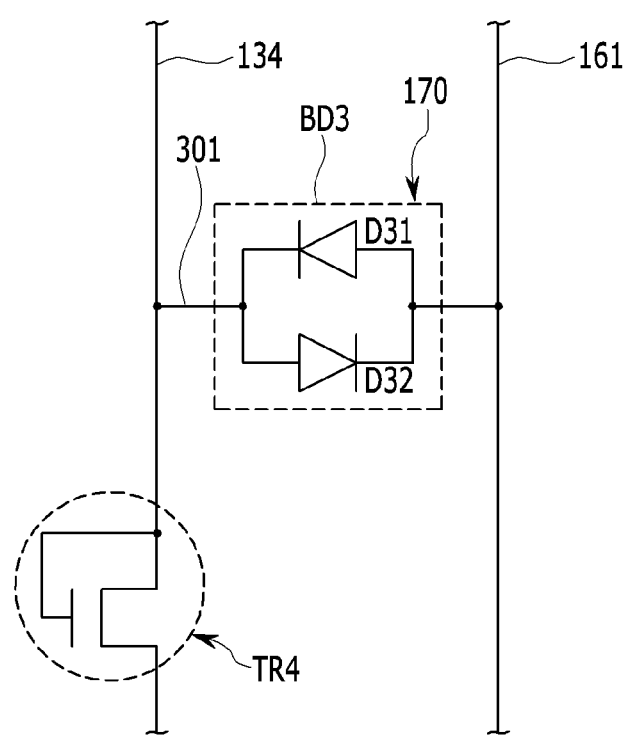
FIG. 3 is an equivalent circuit diagram showing an electrostatic protection unit according to an exemplary embodiment of the present invention.

FIG. 3 is an equivalent circuit diagram showing an electrostatic protection unit of the display device according to an exemplary embodiment of the present invention.

Referring to FIG. 3, the electrostatic protection unit 170 according to an exemplary embodiment of the present invention is connected between the vertical start line 134 and the common voltage line 161, so as to distribute electrostatic introduced into the vertical start line 134 to the common voltage line 161.

The electrostatic protection unit 170 includes at least one back-to-back diode BD3 connected in series between the vertical start line 134 and the common voltage line 161. The back-to-back diode BD3 has one end directly connected to the vertical start line 134 and the other end connected to the common voltage line 161.

According to an exemplary embodiment, the back-to-back diode BD3, i.e., diodes D31 and D32, may be directly connected to the vertical start line 134 by a connection line 301 formed of the same material as the vertical start line 134 on the same layer as the vertical start line 134. According to another exemplary embodiment, the back-to-back diode BD3 may be electrically connected to the vertical start line 134 by a contact hole or a contact bridge.

If the vertical start line 134 is applied with high voltage due to electrostatic, the back-to-back diode BD3 may discharge charges charged in the vertical start line 134 to the common voltage line 161. That is, if potential of the vertical start line 134 becomes higher than a threshold voltage of a diode D32 connected to the vertical start line 134 in forward direction, the diode D32 is turned on and the vertical start line 134 and the common voltage line 161 are electrically connected to each other. Therefore, the charges charged in the vertical start line 134 are introduced into the common voltage line 161.

By the above-mentioned processes, electrostatic introduced into the vertical start line 134 is distributed to the common voltage line 161, thereby preventing a switching element TR4 of the first stage SRC1 of the gate driving unit 110 from being damaged by electrostatic.

Figure 4:
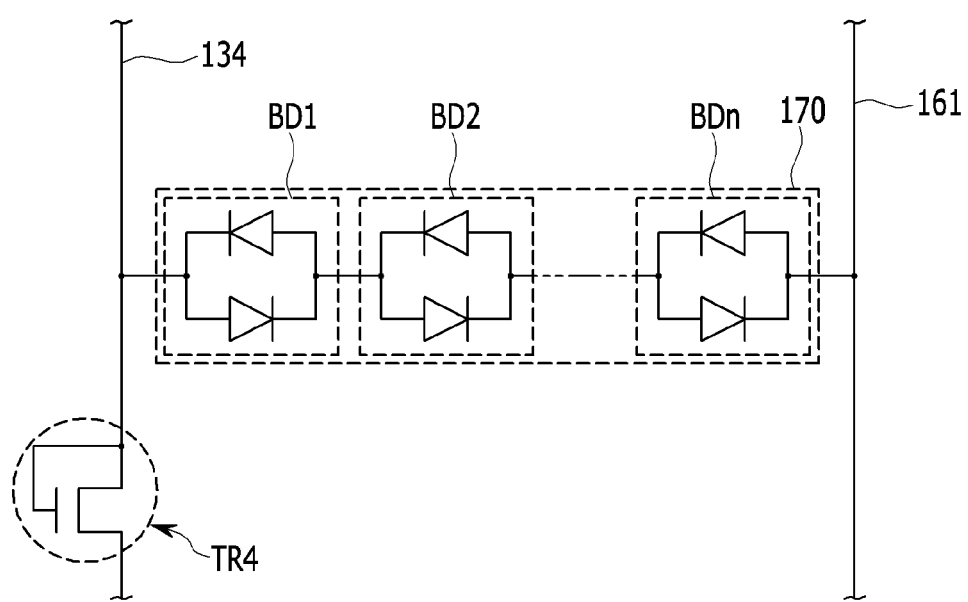
FIG. 4 is an equivalent circuit diagram showing an electrostatic protection unit according to another exemplary embodiment of the present invention.

Although FIG. 3 describes the case in which the electrostatic protection unit 170 includes one back-to-back diode connected in series between the vertical start line 134 and the common voltage line 161, by way of example, exemplary embodiments of the present invention are not limited thereto. According to some exemplary embodiments, as shown in FIG. 4, the electrostatic protection unit 170 may include a plurality of back-to-back diodes BD1, BD2, . . . , BDn connected in series with each other between the vertical start line 134 and the common voltage line 161.

Although FIG. 3 describes the case in which the electrostatic protection unit 170 is connected between the vertical start line 134 and the common voltage line 161 so as to distribute electrostatic introduced into the vertical start line 134 to the common voltage line 161, by way of example, exemplary embodiments of the present invention are not limited thereto. According to some exemplary embodiments, the electrostatic protection unit 170 may be connected between a distribution line other than the common voltage line 161 and the vertical start line 134, so as to distribute electrostatic introduced into the vertical start line 134 to the distribution line.

In addition to the exemplary embodiments described above, the electrostatic protection unit in the display device according to an exemplary embodiment of the present invention may be variously modified.

Hereinafter, exemplary embodiments of the electrostatic protection unit which may be modified will be described with reference to FIGS. 5 to 11.

Figure 5:
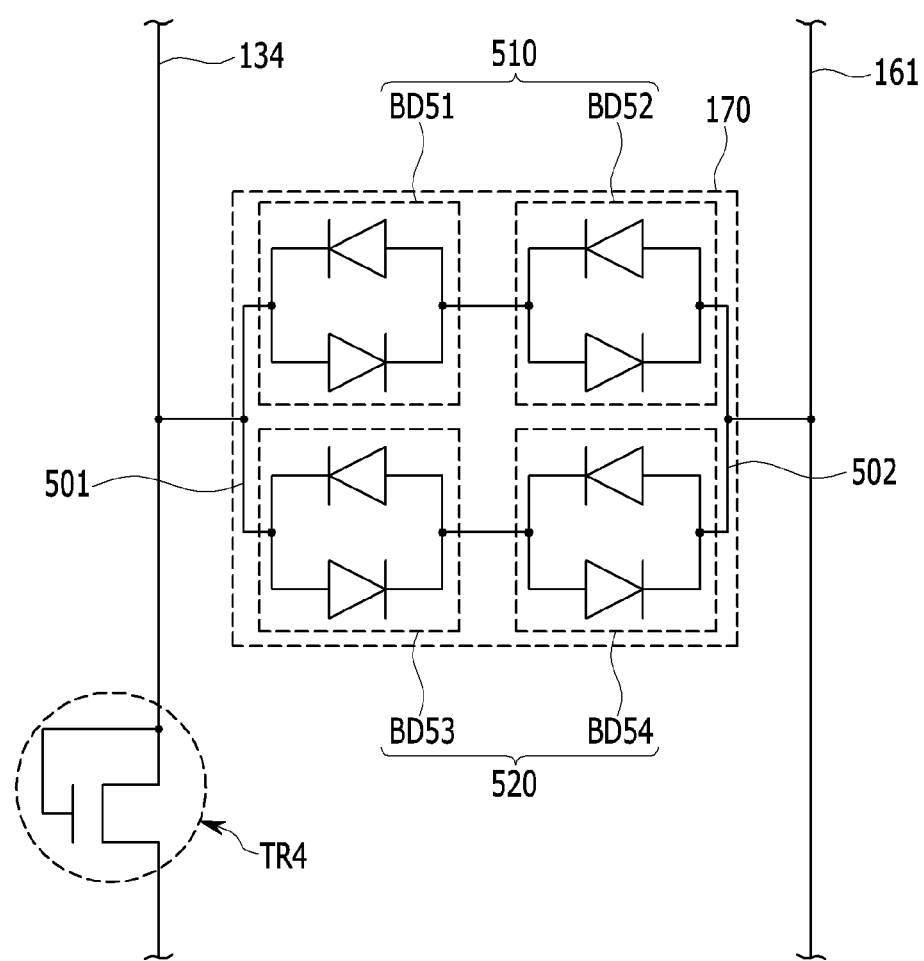
FIG. 5 is an equivalent circuit diagram showing an electrostatic protection unit according to still another exemplary embodiment of the present invention.

FIG. 5 is an equivalent circuit diagram showing an electrostatic protection unit according to another exemplary embodiment of the present invention.

Referring to FIG. 5, an electrostatic protection unit 170 according to another exemplary embodiment of the present invention includes a plurality of diode units 510 and 520 connected in parallel to each other between the vertical start line 134 and the common voltage line 161.

First and second diode units 510 and 520 include one or more back-to-back diodes BD1, BD52, BD53, and BD54 connected in series with each other. The first and second diode units 510 and 520 each have one end connected to the other by a first connection line 501 and the other ends connected to each other by a second connection line 502. The first connection line 501 is connected to the vertical start line 134 and the second connection line 502 is connected to the common voltage line 161.

According to an exemplary embodiment, the first connection line 501 may be formed of the same material as the vertical start line 134 on the same layer as the vertical start line 134 so as to be directly connected to the vertical start line 134. According to another exemplary embodiment, the first connection line 501 may be connected to the vertical start line 134 by a contact hole or a contact bridge.

The electrostatic protection unit 170 having the structure shown in FIG. 5 distributes electrostatic introduced into the vertical start line 134 into multiple paths formed by the plurality of back-to-back diodes BD51, BD52, BD53, and BD54. Therefore, electrostatic introduced into the vertical start line 134 consumes energy thereof by the back-to-back diodes BD51, BD52, BD53, and BD54 or is distributed to the common voltage line 161, thereby preventing a switching element TR4 of the gate driving unit 110 from being damaged by electrostatic.

In addition, by connecting the back-to-back diodes BD51, BD52, BD53, and BD54 in parallel to each other between the vertical start line 134 and the common voltage line 161, even in a case in which some back-to-back diodes are opened due to electrostatic, the function of the electrostatic protection unit 170 may be supplemented by the rest of the back-to-back diodes.

Although FIG. 5 shows the case in which the respective diode units connected in parallel to each other include the two back-to-back diodes connected in series with each other, by way of example, the exemplary embodiments of the present invention are not limited thereto. Exemplary embodiments of the present invention are not limited thereto. According to some exemplary embodiments, the respective diode units connected in parallel to each other between the vertical start line 134 and the common voltage line 161 may include one or three or more back-to-back diodes connected in series with each other.

Figure 6:
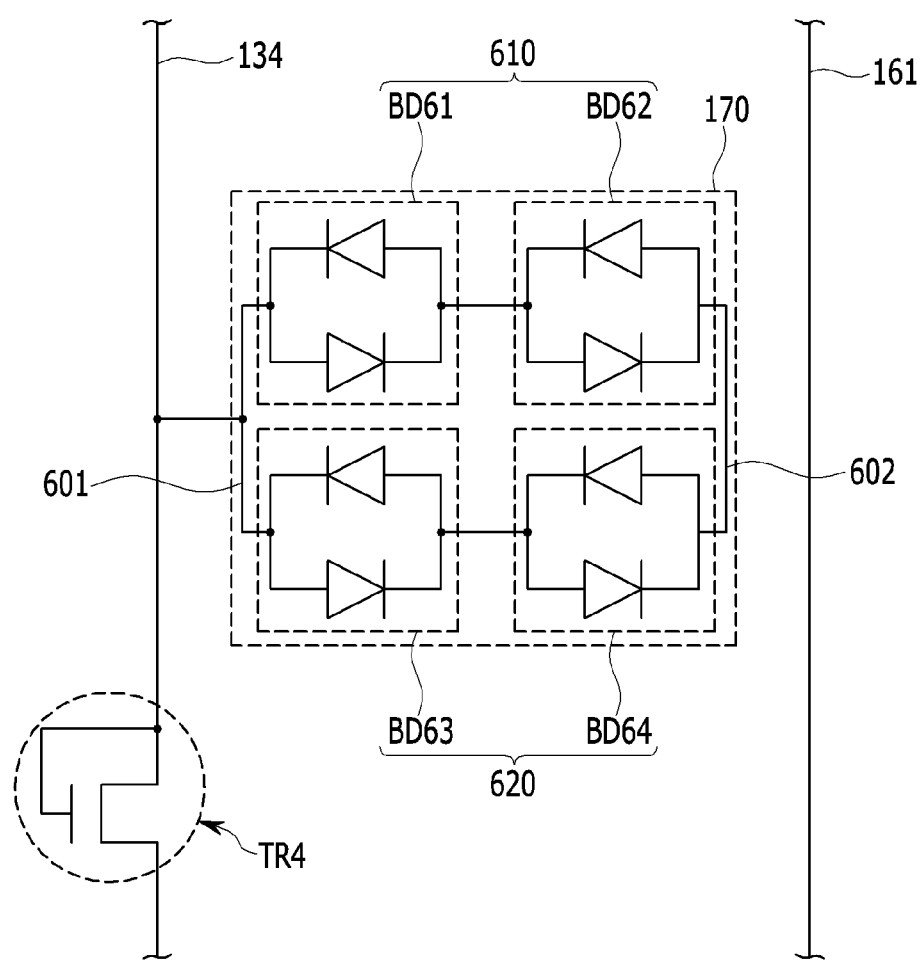
FIG. 6 is an equivalent circuit diagram showing an electrostatic protection unit according to still another exemplary embodiment of the present invention.

FIG. 6 is an equivalent circuit diagram showing an electrostatic protection unit according to still another exemplary embodiment of the present invention.

Referring to FIG. 6, an electrostatic protection unit 170 according to still another exemplary embodiment of the present invention includes a plurality of diode units 610 and 620 connected in parallel to each other and has one end connected to the vertical start line 134.

First and second diode units 610 and 620 include one or more back-to-back diodes BD61, BD62, BD63, and BD64 connected in series with each other. The first and second diode units 610 and 620 each have one end connected to the other by a first connection line 601 and the other ends connected to each other by a second connection line 602. The first connection line 601 is connected to the vertical start line 134. Therefore, the first and second diode units 610 and 620 form a circulation loop for electrostatic introduced into the vertical start line 134.

According to an exemplary embodiment, the first connection line 601 may be formed of the same material as the vertical start line 134 on the same layer as the vertical start line 134 so as to be directly connected to the vertical start line 134. According to another exemplary embodiment, the first connection line 601 may be formed on a layer different from the vertical start line 134 or formed of a material different from the vertical start line 134 so as to be connected to the vertical start line 134 by a contact hole or a contact bridge.

The electrostatic protection unit 170 having the structure shown in FIG. 6 distributes electrostatic introduced into the vertical start line 134 into the circulation path formed by the plurality of back-to-back diodes BD61, BD62, BD63, and BD64. Therefore, electrostatic introduced into the vertical start line 134 is circulated and consumes energy thereof by the back-to-back diodes BD61, BD62, BD63, and BD64, and a time until electrostatic is again discharged to the vertical start line 134 is increased. Therefore, it is possible to prevent a switching element TR4 of a first stage SRC1 of the gate driving unit 110 from being damaged by electrostatic.

Meanwhile, although FIG. 6 shows the case in which the respective diode units connected in parallel to each other include the two back-to-back diodes connected in series with each other, by way of example, the exemplary embodiments of the present invention are not limited thereto. Exemplary embodiments of the present invention are not limited thereto. According to some exemplary embodiments, the respective diode units connected in parallel to each other may include one or three or more back-to-back diodes connected in series with each other.

Figure 7:
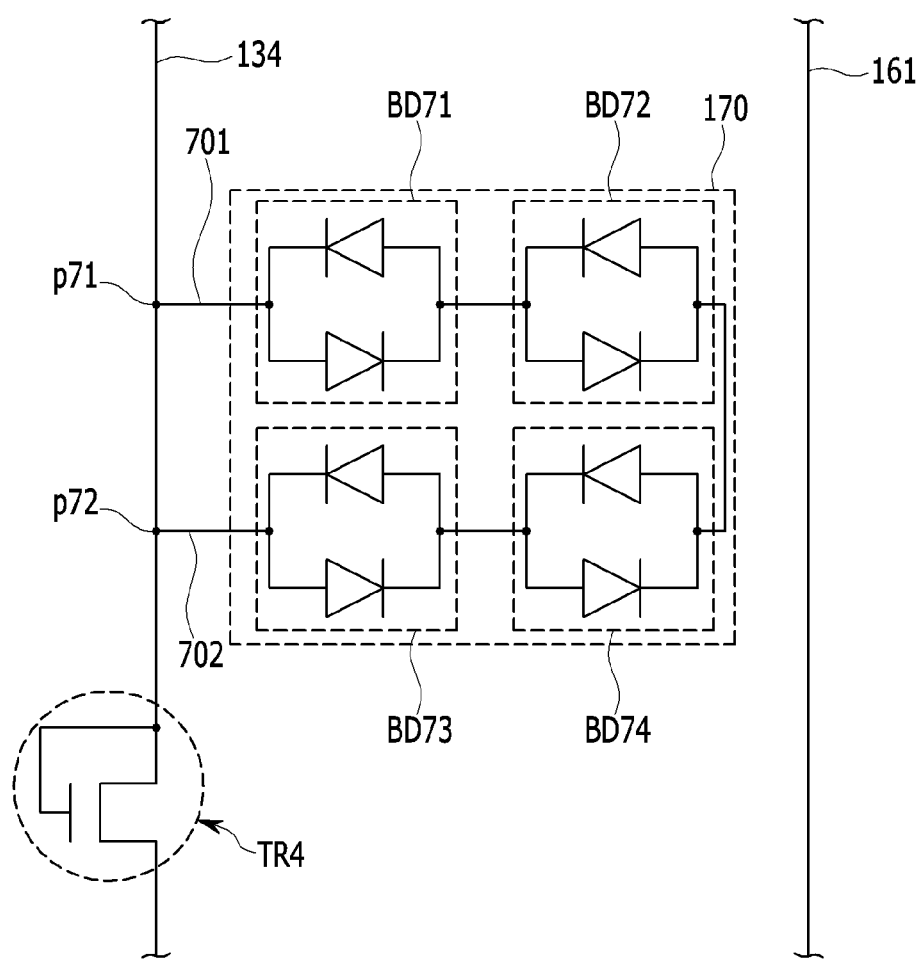
FIG. 7 is an equivalent circuit diagram showing an electrostatic protection unit according to still another exemplary embodiment of the present invention.

FIG. 7 is an equivalent circuit diagram showing an electrostatic protection unit according to still another exemplary embodiment of the present invention.

Referring to FIG. 7, an electrostatic protection unit 170 according to still another exemplary embodiment of the present invention includes a plurality of back-to-back diodes BD71, BD72, BD73, and BD74 connected in series with each other.

The electrostatic protection unit 170 has both ends connected to different points p71 and p72 of the vertical start line 134, respectively. The back-to-back diodes BD71 and BD73 positioned at opposite ends among the plurality of back-to-back diodes BD71, BD72, BD73, and BD74 connected in series with each other are each connected to the different points p71 and p72 of the vertical start line 134 by two connection lines 701 and 702.

In the electrostatic protection unit 170 having the structure described above, electrostatic introduced into the vertical start line 134 is distributed into multiple paths and energy thereof is consumed by the back-to-back diodes BD71, BD72, BD73, and BD74. In addition, a time until charges charged in the electrostatic protection unit 170 are again discharged to the vertical start line 134 while passing through the plurality of back-to-back diodes BD71, BD72, BD73, and BD74 is increased. Therefore, it is possible to prevent a switching element TR4 of a first stage SRC1 of the gate driving unit 110 from being damaged by electrostatic.

In addition, by connecting the series connected back-to-back diodes BD71 and BD72 and the series connected back-to-back diodes BD73 and BD74 in parallel to each other between the first node p71 and the second node p72, even in a case in which some back-to-back diodes are opened due to electrostatic, the function of the electrostatic protection unit 170 may be supplemented by the rest of the back-to-back diodes.

The electrostatic protection unit 170 having the structure shown in FIG. 7 distributes electrostatic introduced into the vertical start line 134 into the plurality of back-to-back diodes BD71, BD72, BD73, and BD74 through the two connection lines 701 and 702. Therefore, paths into which electrostatic is distributed are increased as compared to the electrostatic protection unit of FIG. 6 described above, thereby increasing an electrostatic distributing effect.

Meanwhile, although FIG. 7 describes the case in which the electrostatic protection unit 170 includes four back-to-back diodes connected in series between the different points of the vertical start line 134, by way of example, exemplary embodiments of the present invention are not limited thereto. According to some exemplary embodiments, the electrostatic protection unit may include the number of back-to-back diode less or larger than four.

Figure 8:
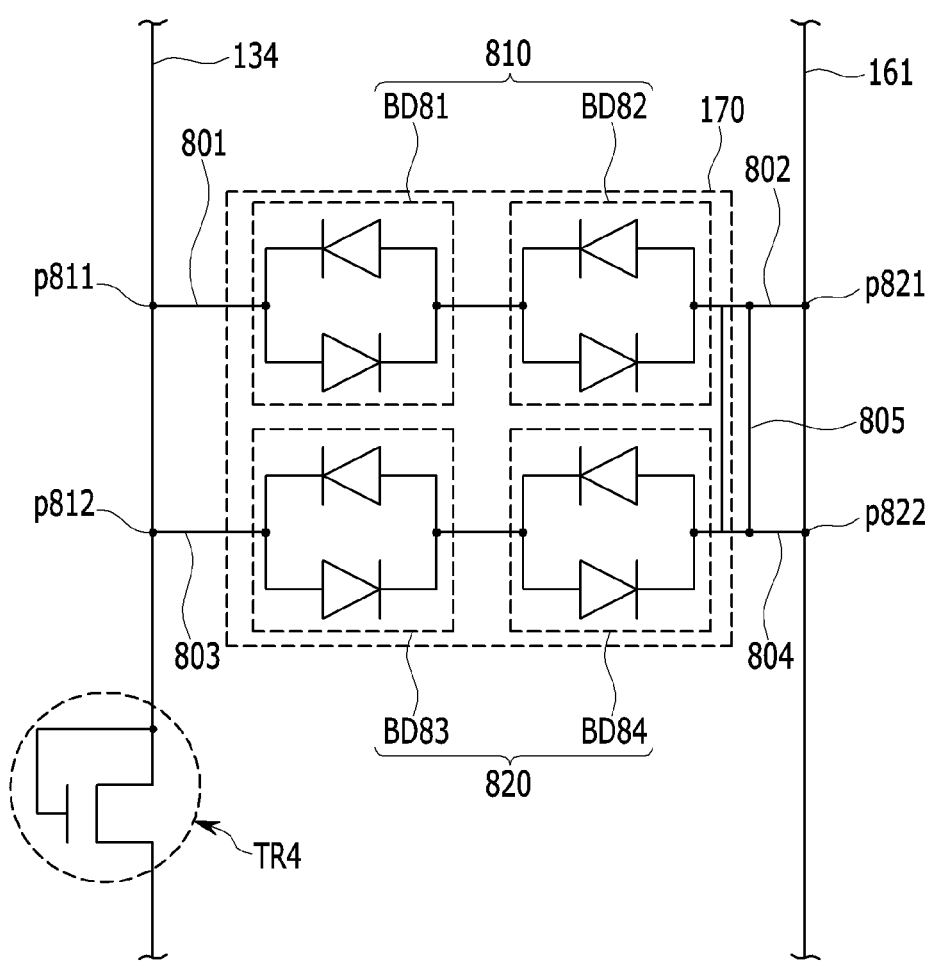
FIG. 8 is an equivalent circuit diagram showing an electrostatic protection unit according to still another exemplary embodiment of the present invention.

FIG. 8 is an equivalent circuit diagram showing an electrostatic protection unit according to still another exemplary embodiment of the present invention.

Referring to FIG. 8, an electrostatic protection unit 170 according to still another exemplary embodiment of the present invention includes a plurality of diode units 810 and 820 connected in parallel to each other between the vertical start line 134 and the common voltage line 161.

A first diode unit 810 includes one or more back-to-back diodes BD81 and BD82 connected in series with each other between the vertical start line 134 and the common voltage line 161. The first diode unit 810 has one end connected to the vertical start line 134 by a first connection line 801 and the other end connected to the common voltage line 161 by a second connection line 802.

A second diode unit 820 includes one or more back-to-back diodes BD83 and BD84 connected in series with each other between the vertical start line 134 and the common voltage line 161. The second diode unit 820 has one end connected to the vertical start line 134 by a third connection line 803 and the other end connected to the common voltage line 161 by a fourth connection line 804.

The first and third connection lines 801 and 803 are connected to different points p811 and p812 of the vertical start line 134, and the second and fourth connection lines 802 and 804 are connected to different points p821 and p822 of the common voltage line 161.

According to an exemplary embodiment, the first and third connection lines 801 and 803 connecting the vertical start line 134 to the first and second diode units 810 and 820, respectively, may be formed of the same material as the vertical start line 134 on the same layer as the vertical start line 134. According to an exemplary embodiment, the first and third connection lines 801 and 803 connecting the vertical start line 134 to the first and second diode units 810 and 820, respectively, may be formed on a layer different from the vertical start line 134 or may be formed of a material different from the vertical start line 134, so as to be provided in a contact hole or a contact bridge.

A dummy line 805 is connected between the second and fourth connection lines 803 and 804 connecting the first and second diode units 810 and 820 to different points p821 and p822 of the common voltage line 161.

The electrostatic protection unit 170 having the structure shown in FIG. 8 distributes electrostatic introduced into the vertical start line 134 into the common voltage line 161 through multiple paths formed by the plurality of back-to-back diodes BD81, BD82, BD83, and BD84. Therefore, it is possible to prevent a switching element TR4 of the gate driving unit 110 from being damaged by electrostatic.

In addition, since the electrostatic protection unit 170 having the structure shown in FIG. 8 has the first and second diode units 810 and 820 connected in parallel to each other between the vertical start line 134 and the common voltage line 161, even in a case in which some back-to-back diodes are opened due to electrostatic, the function of the electrostatic protection unit 170 may be supplemented by the rest back-to-back diodes.

The electrostatic protection unit 170 having the structure shown in FIG. 8 distributes electrostatic introduced into the vertical start line 134 into the plurality of back-to-back diodes BD81, BD82, BD83, and BD84 through the two connection lines 801 and 802 at the different points. In addition, a plurality of electrostatic distribution paths are formed between the vertical start line 134 and the common voltage line 161 by further forming the dummy line 805. Therefore, an electrostatic distribution effect is increased by an increased electrostatic distribution path as compared to the electrostatic protection units of FIGS. 5 and 6 described above.

Meanwhile, although FIG. 8 shows the case in which the respective diode units connected in parallel to each other include the two back-to-back diodes connected in series with each other, by way of example, the exemplary embodiments of the present invention are not limited thereto. Exemplary embodiments of the present invention are not limited thereto. According to some exemplary embodiments, the respective diode units connected in parallel to each other may include one or three or more back-to-back diodes connected in series with each other.

Figure 9:
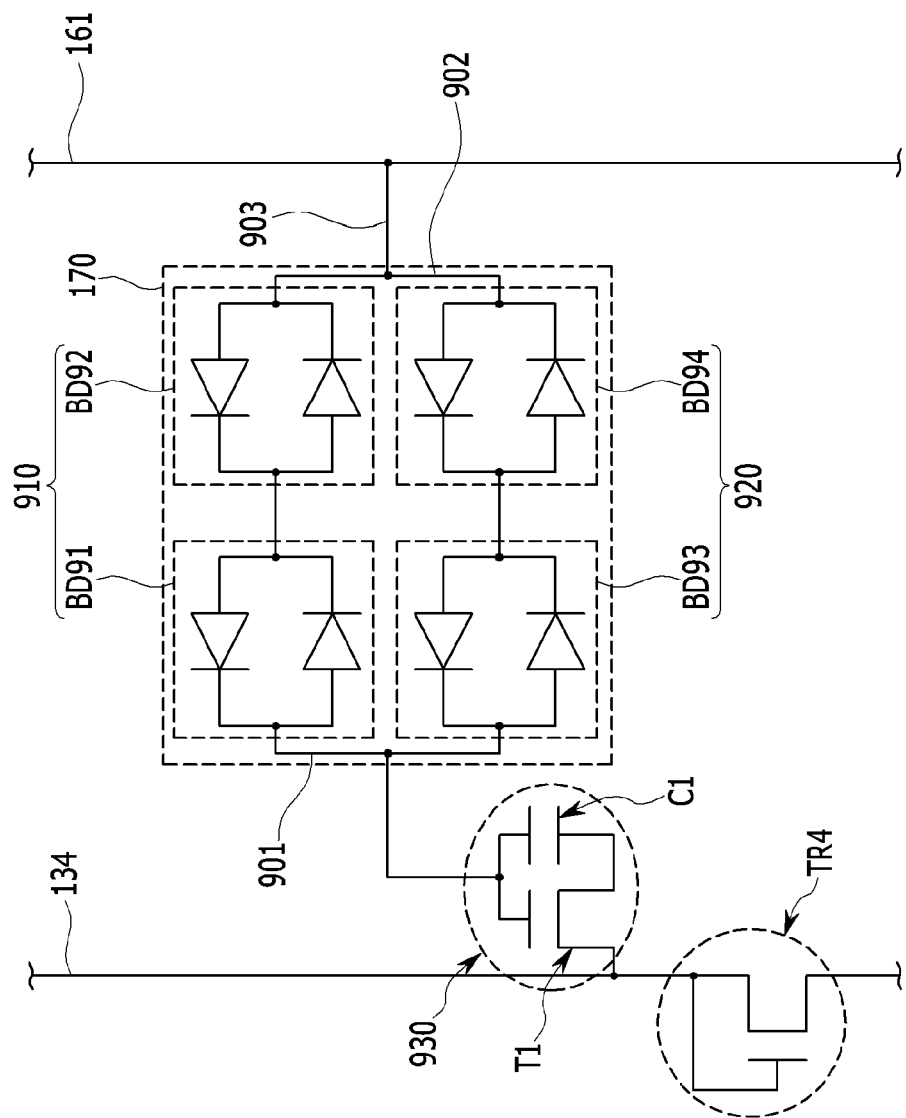
FIG. 9 is an equivalent circuit diagram showing an electrostatic protection unit according to still another exemplary embodiment of the present invention.

FIG. 9 is an equivalent circuit diagram showing an electrostatic protection unit according to still another exemplary embodiment of the present invention.

Referring to FIG. 9, an electrostatic protection unit 170 according to still another exemplary embodiment of the present invention includes a ticks thin film transistor (TFT) 930 and a plurality of diode units 910 and 920 connected in parallel to each other.

The ticks thin film transistor 930 is connected between the plurality of diode units 910 and 920 connected and the vertical start line 134. The ticks thin film transistor 930 may show an equivalent circuit diagram of a transistor T1 and a capacitor C1 connected between a source and a gate of the transistor T1. A drain of the transistor T1 is connected to the vertical start line 134. The gate of the transistor T1 is connected to a first connection line 901 connecting one end of diode unit 910 to one end of diode unit 920. The ticks thin film transistor 930 may accommodate electrostatic introduced into the vertical start line 134 and may also be broken on behalf of a switching element TR4 of the gate driving unit 110. In addition, the ticks thin film transistor 930 may block currents leaked from back-to-back diodes BD91, BD92, BD93, and BD94 to the vertical start line 134.

First and second diode units 910 and 920 include one or more back-to-back diodes BD91, BD92, BD93, and BD94 connected in series with each other.

The first and second diode units 910 and 920 each have one end connected to each other by the first connection line 901 and the other ends connected to each other by a second connection line 902. The first and second diode units 910 and 920 each have one end connected to the ticks thin film transistor 930 by the first connection line 901 and the other ends connected to the common voltage line 161 by the second connection line 902.

The electrostatic protection unit 170 having the structure shown in FIG. 9 distributes electrostatic introduced into the vertical start line 134 into multiple paths formed by the plurality of back-to-back diodes BD91, BD92, BD93, and BD94. Therefore, electrostatic introduced into the vertical start line 134 is distributed to the common voltage line 161 or consumes energy thereof by the back-to-back diodes BD91, BD92, BD93, and BD9, thereby preventing a switching element TR4 of the first stage SRC1 of the gate driving unit 110 from being damaged by electrostatic.

In addition, by connecting the back-to-back diodes BD91, BD92, BD93, and BD94 in parallel to each other between the vertical start line 134 and the common voltage line 161, even in a case in which some back-to-back diodes are opened due to electrostatic, the function of the electrostatic protection unit 170 may be supplemented by the rest of the back-to-back diodes.

In addition, by connecting the ticks thin film transistor 930 between the vertical start line 930 and the back-to-back diodes BD91, BD92, BD93, and BD94, currents leaked from the back-to-back diodes to the vertical start line 134 may be blocked.

Meanwhile, although FIG. 9 shows the case in which the respective diode units connected in parallel to each other include the two back-to-back diodes connected in series with each other, by way of example, the exemplary embodiments of the present invention are not limited thereto. Exemplary embodiments of the present invention are not limited thereto. According to some exemplary embodiments, the respective diode units connected in parallel to each other may include one or three or more back-to-back diodes connected in series with each other.

Figure 10:
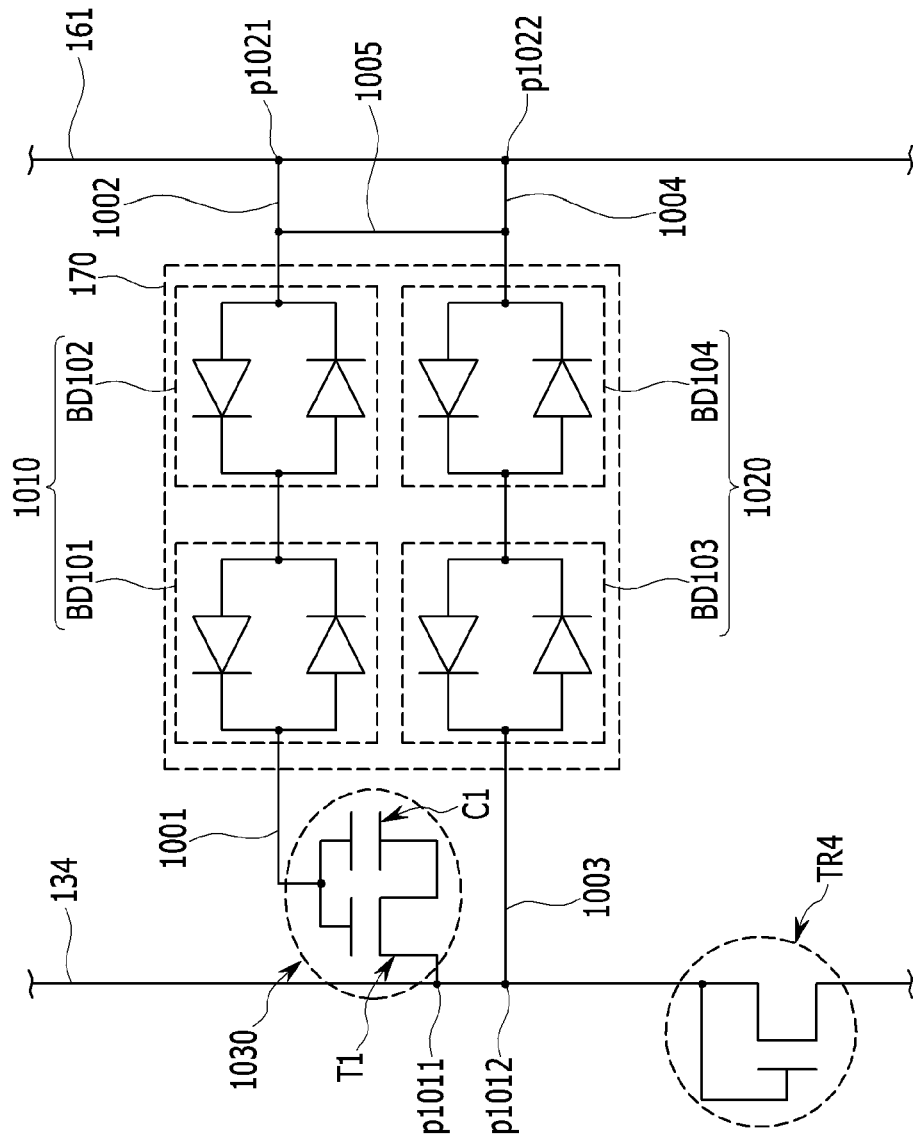
FIG. 10 is an equivalent circuit diagram showing an electrostatic protection unit according to still another exemplary embodiment of the present invention.

FIG. 10 is an equivalent circuit diagram showing an electrostatic protection unit according to still another exemplary embodiment of the present invention.

Referring to FIG. 10, an electrostatic protection unit 170 according to still another exemplary embodiment of the present invention includes a ticks thin film transistor 1030 and a plurality of diode units 1010 and 1020 connected between the vertical start line 134 and the common voltage line 161.

The ticks thin film transistor 1030 is connected between the vertical start line 134 and a first diode unit 1010. The ticks thin film transistor 1030 may show an equivalent circuit diagram of a transistor T1 and a capacitor C1 connected between a source and a gate of the transistor T1. A drain of the transistor T1 is connected to the vertical start line 134. A gate of the transistor T1 is connected to one end of a first diode unit 1010. The ticks thin film transistor 1030 may accommodate electrostatic introduced into the vertical start line 134 and may also be broken on behalf of a switching element TR4 of the gate driving unit 110. In addition, the thin film transistor 1030 may block currents leaked from back-to-back diodes BD101 and BD102 to the vertical start line 134.

The first diode unit 1010 includes one or more back-to-back diodes BD101 and BD102 connected in series with each other between the vertical start line 134 and the common voltage line 161. The first diode unit 1010 has one end connected to the gate of the ticks thin film transistor 134 by a first connection line 1001 and the other end connected to the common voltage line 161 by a second connection line 1002.

The second diode unit 1020 includes one or more back-to-back diodes BD103 and BD104 connected in series with each other between the vertical start line 134 and the common voltage line 161. The second diode unit 1020 has one end connected to the vertical start line 134 by a third connection line 1003 and the other end connected to the common voltage line 161 by a fourth connection line 1004.

On the vertical start line 134, a point to which the ticks thin film transistor 1030 and the first diode unit 1010 are connected and a point p1012 to which the second diode unit 1020 is connected are spaced apart from each other by a predetermine interval. That is, the third connection line 1003 connecting the drain of the ticks thin film transistor 1030 and the second diode unit 1020 to the vertical start line 134 is connected to different points p1011 and p1012 of the vertical start line 134. In addition, the second and fourth connection lines 1002 and 1004 each connecting the first diode unit 1010 and the second diode unit 1020 to the common voltage line 161 are connected to different points p1021 and p1022 of the common voltage line 161.

A dummy line 1005 is connected between the second and fourth connection lines 1002 and 1004 which are each connected to the common voltage line 161.

The electrostatic protection unit 170 having the structure shown in FIG. 10 distributes electrostatic introduced into the vertical start line 134 into the common voltage line 161 through multiple paths formed by the plurality of back-to-back diodes BD101, BD102, BD103, and BD104. Therefore, it is possible to prevent a switching element TR4 of the gate driving unit 110 from being damaged by electrostatic.

Since the electrostatic protection unit 170 having the structure shown in FIG. 10 has the back-to-back diodes BD101, BD102, BD103, and BD104 connected in parallel to each other between the vertical start line 134 and the common voltage line 161, even in a case in which some back-to-back diodes are opened due to electrostatic, the function of the electrostatic protection unit 170 may be supplemented by the rest of the back-to-back diodes.

The electrostatic protection unit 170 having the structure shown in FIG. 10 distributes electrostatic introduced into the vertical start line 134 into the plurality of back-to-back diodes BD101, BD102, BD103, and BD104 at different points. In addition, a plurality of electrostatic distribution paths are formed between the vertical start line 134 and the common voltage line 161 by further forming the dummy line 1005. Therefore, an electrostatic distribution effect is increased by an increased electrostatic distribution path as compared to the electrostatic protection units of FIGS. 5 and 6 described above.

In addition, by connecting the ticks thin film transistor 1030 between the vertical start line 1030 and the back-to-back diodes BD101 and BD102, currents leaked from the back-to-back diodes BD101 and BD102 to the vertical start line 134 may be blocked.

Meanwhile, although FIG. 10 shows the case in which the respective diode units connected in parallel to each other include the two back-to-back diodes connected in series with each other, by way of example, the exemplary embodiments of the present invention are not limited thereto. Exemplary embodiments of the present invention are not limited thereto. According to some exemplary embodiments, the respective diode units connected in parallel to each other may include one or three or more back-to-back diodes connected in series with each other.

Figure 11:
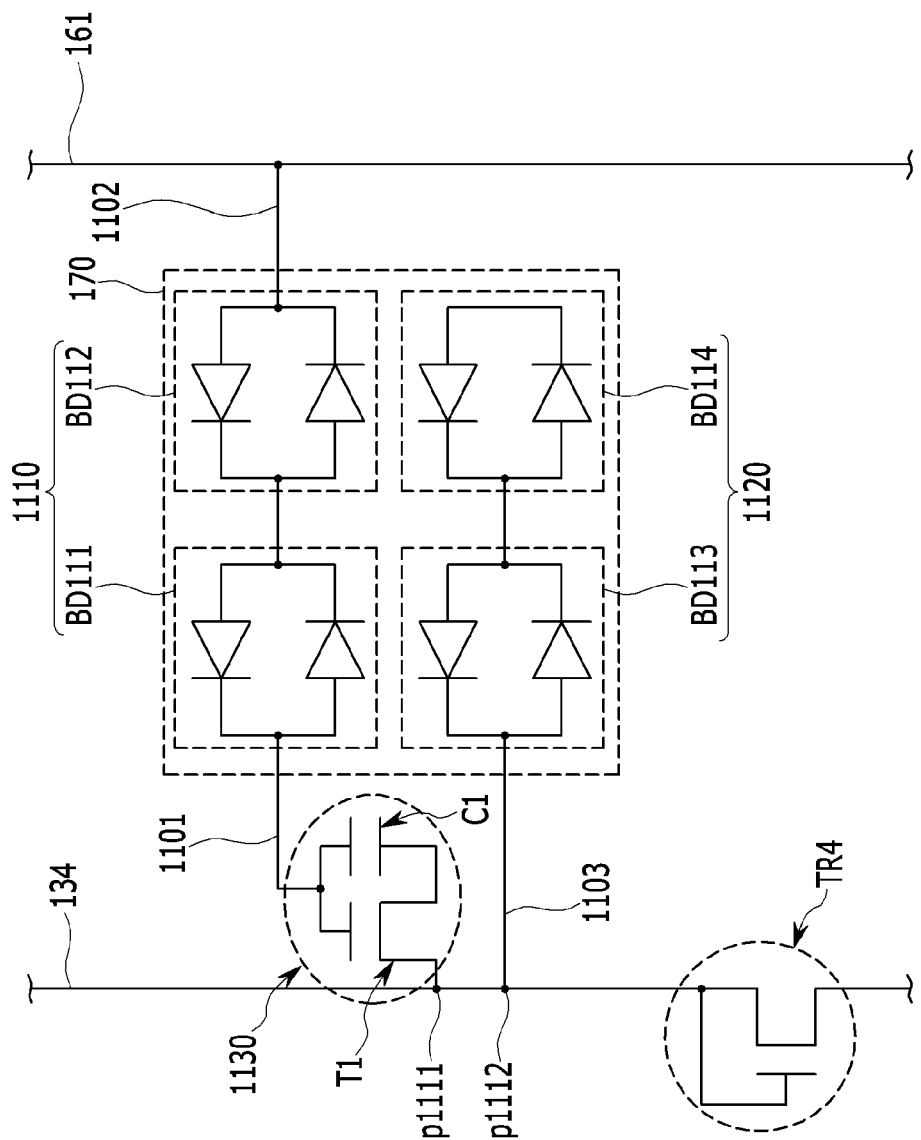
FIG. 11 is an equivalent circuit diagram showing an electrostatic protection unit according to still another exemplary embodiment of the present invention.

FIG. 11 is an equivalent circuit diagram showing an electrostatic protection unit according to still another exemplary embodiment of the present invention.

Referring to FIG. 11, an electrostatic protection unit 170 according to still another exemplary embodiment of the present invention includes a plurality of diode units 1110 and 1120 connected to the vertical start line 134 through different paths so as to be distribute or reduce electrostatic introduced into the vertical start line 134, and a ticks thin film transistor 1130.

The ticks thin film transistor 1130 and the first diode unit 1110 are connected between a first point p1111 of the vertical start line 134 and the common voltage line 161.

The ticks thin film transistor 1130 may show an equivalent circuit of a transistor T1 and a capacitor C1. A gate of the transistor T1 is connected to the first diode unit 1110 by a first connection line 1101. A drain of the transistor T1 is connected to the first point p1111 of the vertical start line 134. The capacitor C1 is connected between a source and the gate of the transistor T1.

The ticks thin film transistor 1130 may accommodate electrostatic introduced into the vertical start line 134 and may also be broken on behalf of a switching element TR4 of the gate driving unit 110. In addition, the thin film transistor 1030 may block currents leaked from back-to-back diodes BD111 and BD112 to the vertical start line 134.

The first diode unit 1110 includes one or more back-to-back diodes BD111 and BD112 connected in series with each other. The first diode unit 1110 has one end connected to the gate of the transistor T1 of the ticks thin film transistor 1130 and the other end connected to the common voltage line 161 by a second connection line 1102.

The second diode unit 1120 is connected to the second point p1112 which is spaced apart from the first point p1111 by a predetermined interval on the vertical start line 134. The second diode unit 1120 includes one or more back-to-back diodes BD113 and BD114 connected in series with each other. The second diode unit 1120 has one end connected to the second point p1112 on the vertical start line 134 by a third connection line 1103.

The electrostatic protection unit 170 having the structure shown in FIG. 11 distributes electrostatic introduced into the vertical start line 134 into multiple paths formed by the plurality of back-to-back diodes BD111, BD112, BD113, and BD114. Therefore, electrostatic introduced into the vertical start line 134 consumes energy thereof by the back-to-back diodes BD111, BD112, BD113, and BD114, and a time until charges charged in the electrostatic protection unit 170 are again discharged to the vertical start line 134 during an electrostatic distribution process is delayed. Therefore, it is possible to prevent a switching element TR4 of a first stage SRC1 of the gate driving unit 110 from being damaged by electrostatic.

The electrostatic protection unit 170 having the structure shown in FIG. 11 distributes electrostatic introduced into the vertical start line 134 into the plurality of back-to-back diodes BD111, BD112, BD113, and BD114 through multiple paths. Therefore, electrostatic introduced into the vertical start line 134 consumes energy thereof by the back-to-back diodes BD111, BD112, BD113, and BD114, and a time until charges charged in the electrostatic protection unit 170 are again discharged to the vertical start line 134 during an electrostatic distribution process is increased. Therefore, it is possible to prevent a switching element TR4 of a first stage SRC1 of the gate driving unit 110 from being damaged by electrostatic.

In addition, by connecting the ticks thin film transistor between the vertical start line 1030 and the back-to-back diodes BD111 and BD112, currents leaked from the back-to-back diodes BD111 and BD112 to the vertical start line 134 may be blocked.

Meanwhile, although FIG. 11 shows the case in which the respective diode units include the two back-to-back diodes connected in series with each, by way of example, the exemplary embodiments of the present invention are not limited thereto. Exemplary embodiments of the present invention are not limited thereto. According to some exemplary embodiments, the respective diode units connected in parallel to each other may include one or three or more back-to-back diodes connected in series with each other.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A display substrate comprising:
    a plurality of pixel units;
    a gate driving unit supplying a gate signal to the plurality of pixel units and including a plurality of shift register circuits which are dependently connected to each other;
    a vertical start line supplying a vertical start signal to the gate driving unit; and
    an electrostatic protection unit including a plurality of back-to-back diodes connected in series with each other between different points of the vertical start line.

2. The display substrate of claim 1, each back-to-back diode including a pair of diodes bidirectionally connected in parallel to each other.

3. A display substrate comprising:
    a plurality of pixel units;
    a gate driving unit, supplying a gate signal to the plurality of pixel units and including a plurality of shift register circuits which are dependently connected to each other;
    a vertical start line supplying a vertical start signal to the gate driving unit;
    a common voltage line supplying a common voltage to the plurality of pixel units; and
    an electrostatic protection unit distributing electrostatic introduced into the vertical start line to the common voltage line, the electrostatic protection unit including:
    a first diode unit connected between the vertical start line and the common voltage line and including one or more first back-to-back diodes connected in series with each other,
    a second diode unit connected between the vertical start line and the common voltage line and including one or more second back-to-back diodes connected in series with each other,
    a first connection line connecting the first diode unit to the common voltage line,
    a second connection line connecting the second diode unit to the common voltage line, and
    a dummy line connected between the first connection line and the second connection line.

4. The display substrate of claim 3, the first and second back-to-back diode units each including:
    a pair of diodes bidirectionally connected in parallel to each other.

5. The display substrate of claim 3, the first diode unit and the second diode unit being connected to different points along; the vertical start line.

6. The display substrate of claim 3, the electrostatic protection unit further including:
    a ticks thin film transistor connected between the vertical start line and the first diode unit.

7. The display substrate of claim 6, the ticks thin film transistor including:
    a transistor having a gate connected to the first diode unit and a drain connected to the vertical start line, and
    a capacitor connected between a source and the gate of the transistor.

8. A display substrate comprising:
    a plurality of pixel units;
    a gate driving unit supplying a gate signal to the plurality of pixel units and including a plurality of shift register circuits which are dependently connected to each other;
    a vertical start line supplying a vertical start signal to the gate driving unit;
    a common voltage line supplying a common voltage to the plurality of pixel units; and
    an electrostatic protection unit distributing electrostatic introduced into the vertical start line to the common voltage line, the electrostatic protection unit including:

a first diode unit connected between the vertical start line and the common voltage line and including one or more first back-to-back diodes connected in series with each other, and a ticks thin film transistor connected between the vertical start line and the first diode unit, wherein the ticks thin film transistor is configured to include a transistor having a gate connected to the common voltage line through the first diode unit and a drain connected to the vertical start line, and a capacitor connected between a source and the gate of the transistor.

9. The display substrate of claim 8, the electrostatic protection unit further including:

a second diode unit connected in parallel to the first diode unit, second diode unit being connected between the vertical start line and the common voltage line and including one or more second back-to-back diodes connected in series with each other.

10. The display substrate of claim 9, the first and second back-to-back diode units each including:

a pair of diodes connected in parallel to each other and having different directions.

\* \* \* \* \*